United States Patent [19]

Imai et al.

[11] Patent Number: 5,206,553
[45] Date of Patent: * Apr. 27, 1993

[54] CLAMPING CIRCUIT

[75] Inventors: Shin-ichi Imai, Yokohama; Akira Sakata, Tokyo, both of Japan

[73] Assignee: Kabushiki Kaisha Toshiba, Kawasaki, Japan

[*] Notice: The portion of the term of this patent subsequent to Nov. 12, 2008 has been disclaimed.

[21] Appl. No.: 831,757

[22] Filed: Feb. 10, 1992

Related U.S. Application Data

[63] Continuation of Ser. No. 728,531, Jul. 11, 1991, abandoned, which is a continuation of Ser. No. 365,383, Jun. 13, 1989, Pat. No. 5,065,056.

[30] Foreign Application Priority Data

Jun. 17, 1988 [JP] Japan .................. 63-149601

[51] Int. Cl.$^5$ .................... H03K 5/05; H03K 5/135
[52] U.S. Cl. .................... 307/540; 307/562; 307/362
[58] Field of Search ............ 307/352, 540, 542, 547, 307/554, 568, 560, 546, 553, 562, 404, 296.6, 555, 359; 328/172, 171, 34

[56] References Cited

U.S. PATENT DOCUMENTS

| | | | |
|---|---|---|---|
| 3,200,346 | 8/1965 | Young | 307/296.6 |
| 3,783,381 | 1/1974 | Oshima | 307/562 |
| 4,315,220 | 2/1982 | Findeisen | 307/562 |
| 4,382,198 | 5/1983 | Ishijima et al. | 307/555 |
| 4,511,814 | 4/1985 | Matsuo et al. | 307/579 |
| 4,544,854 | 10/1985 | Ulmer et al. | 307/579 |
| 4,590,394 | 5/1986 | Pace | 307/555 |
| 4,603,299 | 7/1956 | Monett | 307/359 |
| 4,883,987 | 11/1989 | Fattaruso | 307/494 |
| 4,910,455 | 3/1990 | Nado | 307/362 |

FOREIGN PATENT DOCUMENTS

| | | | |
|---|---|---|---|
| 0056479 | 4/1980 | Japan | 307/359 |
| 0140715 | 11/1981 | Japan | 307/553 |
| 0229973 | 12/1984 | Japan | 307/562 |
| 1342995 | 10/1986 | Japan . | |
| 0129606 | 5/1989 | Japan | 307/540 |

OTHER PUBLICATIONS

"The Art of Electronics", Horowitz et al., Cambridge University Press, p. 95 and p. 335.

*Primary Examiner*—William L. Sikes
*Assistant Examiner*—Toan Tran

[57] ABSTRACT

In a clamping circuit comprising a voltage comparator for comparing an input signal voltage supplied to the signal input terminal and a reference voltage, a clamping circuit of the present invention comprises a bias voltage supplying circuit and a switch circuit inserted between the bias voltage supplying circuit and the signal input terminal. The input signal voltage is compared with the reference voltage by the voltage comparator, and the switch circuit is ON/OFF-controlled on the basis of the comparison result. When the switch circuit is enabled, a bias voltage supplying circuit is supplied to the signal input terminal, and the input signal voltage is clamped at a voltage equal to the reference voltage. When the switch circuit comprises a CMOS transfer gate, a voltage drop does not occur across the switch circuit regardless of the value of the bias voltage.

22 Claims, 8 Drawing Sheets

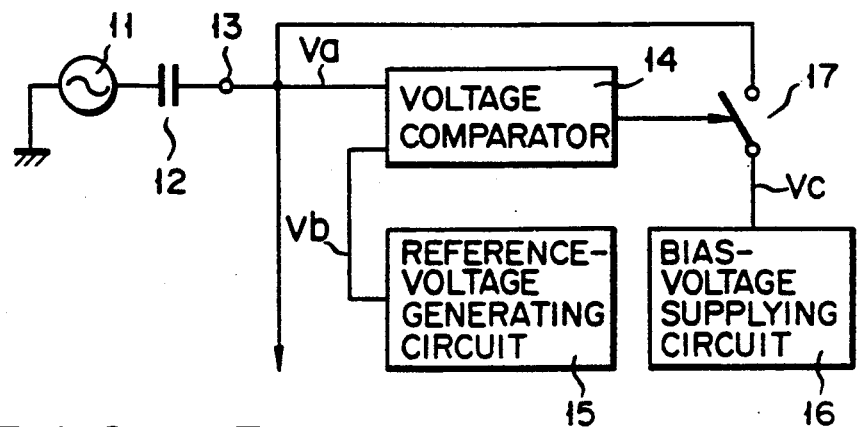
F I G. 3

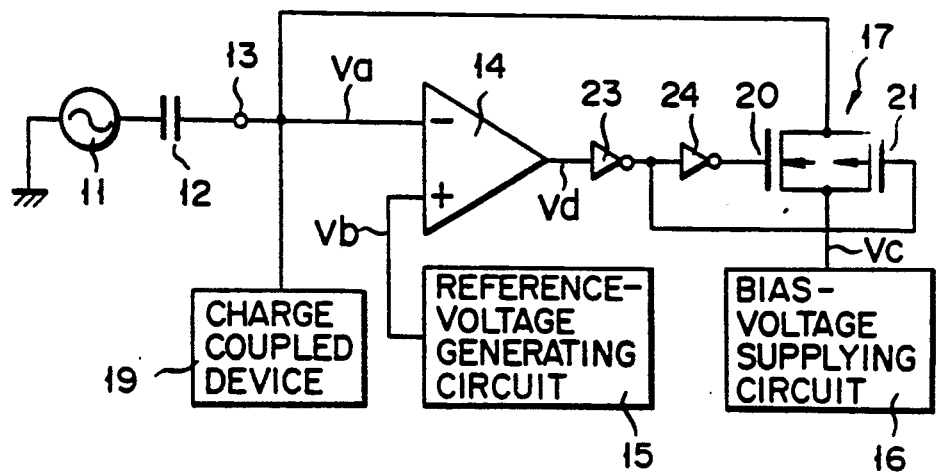
F I G. 4
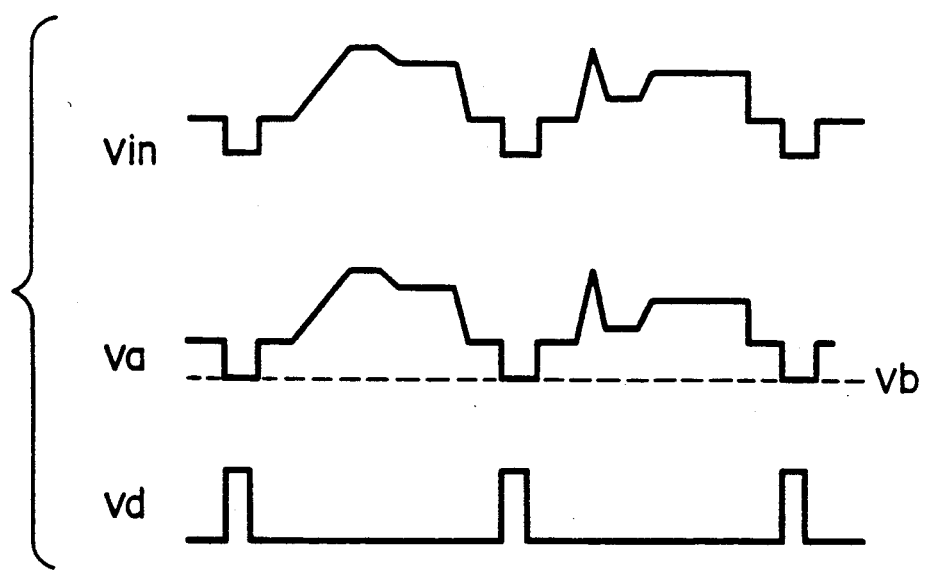
F I G. 5

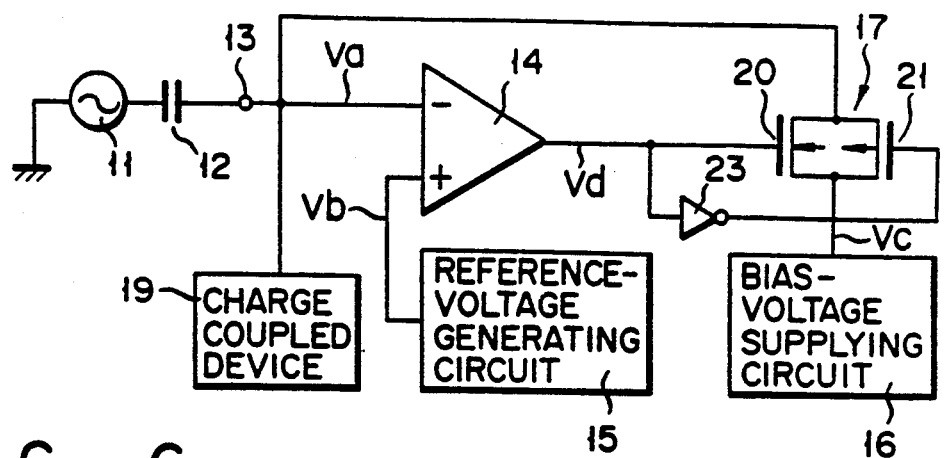
F I G. 6
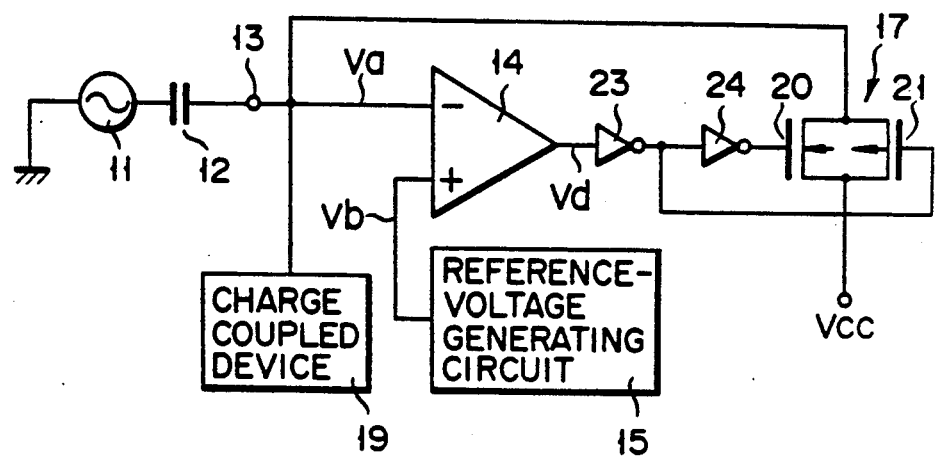
F I G. 7
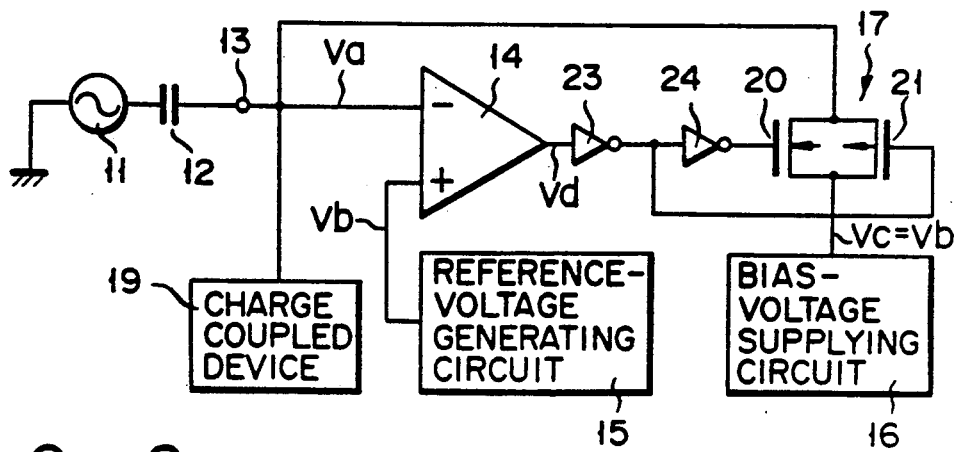
F I G. 8

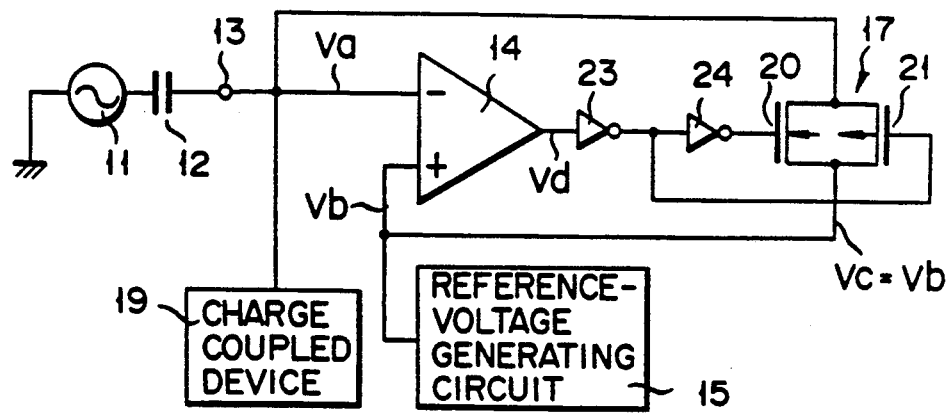
F I G. 9
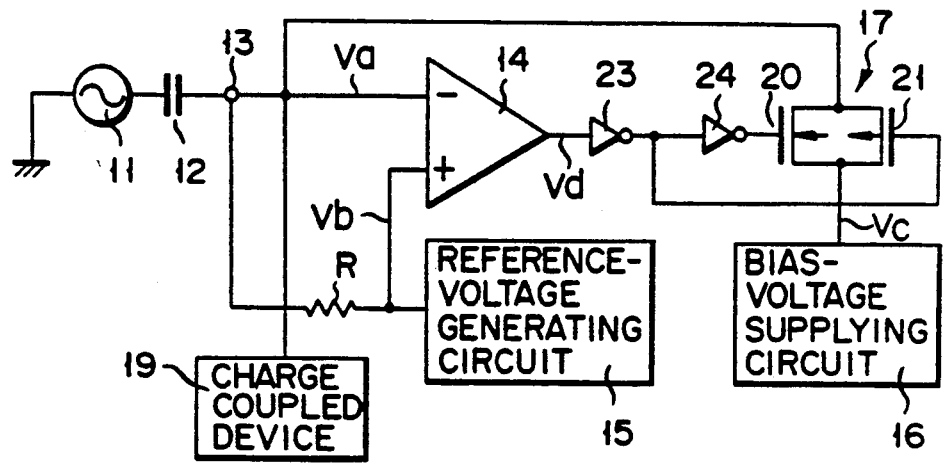
F I G. 10
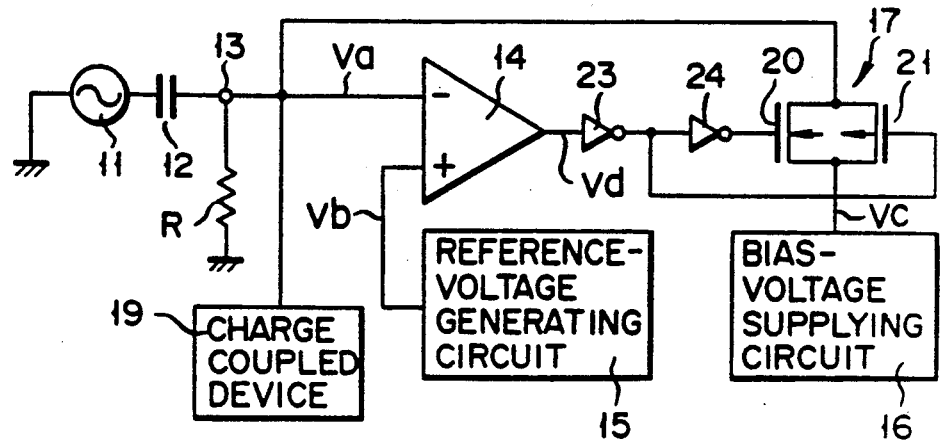
F I G. 11

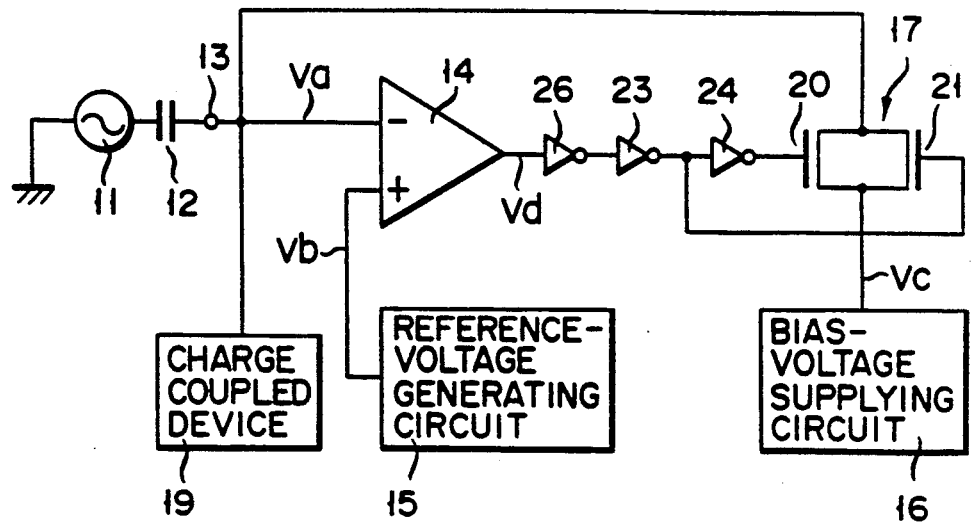
F I G. 15
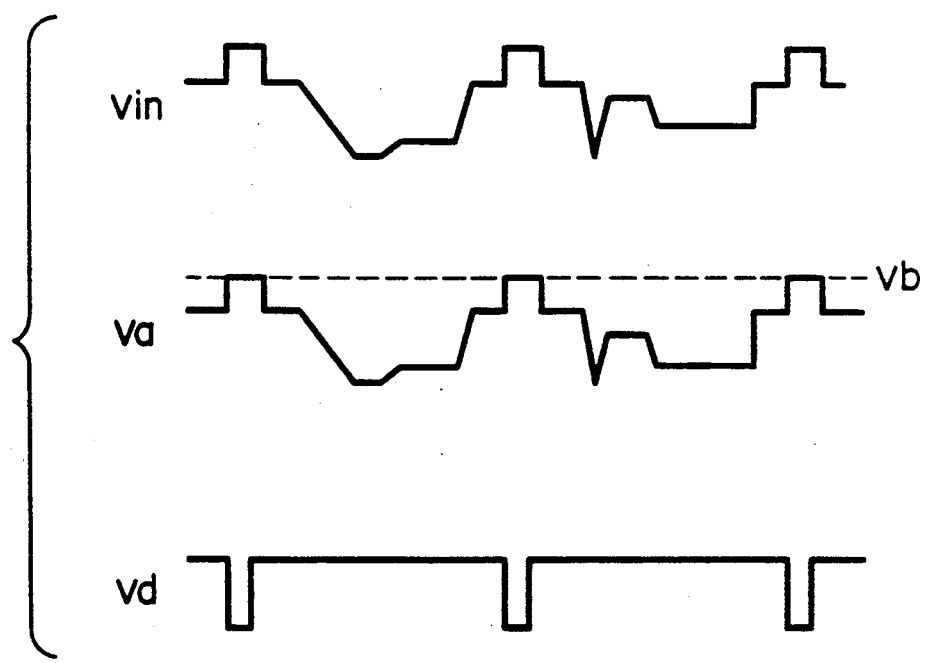
F I G. 16

CLAMPING CIRCUIT

This application is a continuation of application Ser. No. 07/728,531, filed Jul. 11, 1991 now abandoned, which is a continuation of application Ser. No. 07/365,383, filed Jun. 13, 1989, now U.S. Pat. No. 5,065,065, the contents of which are incorporated herein by reference.

BACKGROUND OF THE INVENTION

1. Field of the Invention

The present invention relates to a voltage clamping circuit for a voltage input signal and, more particularly, to a clamping circuit used in an input section of a charge transfer device.

2. Description of the Related Art

Signal input methods for a CTD (Charge Transfer Device) such as a CCD (Charge Coupled Device), BBD (Bucket Brigate Device), or the like include a mean value input bias method, a clamp input bias method, and the like. In the mean value input bias method, it is difficult to effectively utilize a dynamic range of the CTD for a signal, e.g., a video signal, which suffers from a large variation in mean DC level, and the amplitude of an input signal must be reduced. In the clamp input bias method, an operating point of the CTD is set for a signal having a synchronizing signal component, e.g., a horizontal synchronizing signal of a video signal, so that the dynamic range of the CTD can be effectively utilized. For this reason, in the clamp input bias method, a signal having a larger amplitude than in the mean valve input bias method can be input.

FIG. 1 is a block diagram of a conventional clamping circuit used in a CTD which has an input section of the clamp input bias method. A signal from an input signal source 31 is supplied to an input pin 33 of a CTD-IC through a coupling capacitor 32. A signal voltage Va supplied to the input pin 33 is supplied to the inverting input terminal ("−" terminal) of a comparator 34 comprising an operational amplifier, and is also supplied to a CCD 35. On the other hand, the non-inverting input terminal ("+" terminal) of the comparator 34 receives a reference voltage Vb as a clamping voltage from a reference voltage generating circuit 36. The output terminal of the comparator 34 is connected to the drain and gate of an N-channel enhancement-type MOS transistor 37. The source of the MOS transistor 37 is connected to the input pin 33. The MOS transistor 37 serves as a diode.

In this clamping circuit, when the input signal voltage Va applied to the comparator 34 is equal to or higher than the reference voltage Vb, the output from the comparator 34 goes to "0" level, and the MOS transistor 37 is disabled. When the input signal voltage Va is lower than the reference voltage Vb, the output from the comparator 34 goes to "1" level, and the MOS transistor 37 is enabled. Thus, a "1"-level voltage from the comparator 34 is output to the input pin 33. In this case, the input pin 33 is charged by a time constant according to the ON resistance of the transistor 37 and the capacitance of the coupling capacitor 32. When the value Va of the input pin 33 becomes equal to or higher than the reference voltage Vb from the reference voltage generating circuit 36, the output from the comparator 34 is inverted to "0" level. Therefore, a lowest value of the input signal voltage Va is clamped at the reference voltage Vb.

The clamping circuit shown in FIG. 1 clamps the lowest voltage of the input signal voltage Va at the reference voltage Vb. FIG. 2 shows a conventional clamping circuit which clamps a highest voltage of the input signal voltage Va. In this circuit, the gate of the MOS transistor 37 is connected to the input pin 33, so that the highest voltage of the input signal voltage is clamped at the reference voltage Vb.

In the conventional circuit shown in FIG. 1, an upper limit value of the clamping voltage applied to the input pin 33 is equal to a value $V_{CH} = (V_{CC} - V_{th})$ obtained by subtracting a threshold voltage $V_{th}$ of the MOS transistor 37 from the "1"-level output voltage (almost equal to a power supply voltage $V_{CC}$) from the comparator 34. For this reason, the reference voltage Vb cannot be set at a value equal to or higher than $V_{CH} = (V_{CC} - V_{th})$. Therefore, when the power supply voltage $V_{CC}$ is lowered, the value $V_{CH}$ is decreased, and the setting range of the reference voltage Vb is restricted, thus making circuit design difficult. For example, assume that reference voltage Vb is required to be set to 4.5 V when the power supply voltage $V_{CC}$ is set to 5 V. In this case, since the threshold voltage $V_{th}$ of the N-channel enhancement type MOS transistor 37 is normally about 1 V, $V_{CC}(5\ V) - V_{th}(1\ V) < Vb\ (4.5\ V)$, and the requirement cannot be satisfied. Similarly, in the conventional circuit shown in FIG. 2, when the power supply voltage $V_{CC}$ is lowered, the value $V_{CH}$ is decreased, and the setting range of the reference voltage Vb is restricted, thus making circuit design difficult.

In this manner, in the conventional clamping circuit, when the power supply voltage is lowered, the setting range of the reference voltage is restricted, thus making circuit design difficult.

SUMMARY OF THE INVENTION

The present invention has been made in consideration of the above situation, and has as its object to provide a clamping circuit which can widen a setting range of a reference voltage as a clamping voltage and allows easy circuit design even when a power supply voltage is lowered.

The clamping circuit of the present invention comprises a signal input terminal to which an input signal voltage is supplied through a coupling capacitor, a reference voltage generating means, a voltage comparison means including an operational amplifier, having one input terminal to which the input signal voltage supplied to the signal input terminal is applied and the other terminal to which a reference voltage generated by the reference voltage generator is applied, for comparing the two input voltages, a bias voltage supplying means, and a switch means which is inserted between the bias voltage supplying means and the signal input terminal and is on ON/OFF-controlled based on the output from the voltage comparison means.

In the clamping circuit of the present invention, the input signal voltage is compared with the reference voltage by the voltage comparison means, and the switch means is ON/Off-controlled on the basis of the comparison result. When the switch means is enabled, a bias voltage of the bias voltage supplying means is supplied to the signal input terminal, and the input signal voltage is clamped at a voltage equal to the reference voltage.

When the switch means comprises, e.g., a CMOS transfer gate, a voltage drop does not occur across the switch means regardless of the bias voltage.

BRIEF DESCRIPTION OF THE DRAWINGS

FIG. 3 is a block diagram showing the principle of a clamping circuit according to the present invention;

FIG. 4 is a block diagram showing an embodiment of the clamping circuit of the present invention;

FIG. 5 is a waveform chart showing voltage waveforms of respective sections of the clamping circuit shown in FIG. 4;

FIGS. 6 to 12 are block diagrams showing modifications of the clamping circuit shown in FIG. 4;

FIG. 15 is a block diagram showing still another embodiment of a clamping circuit according to the present invention.

FIG. 16 is a waveform chart showing voltage waveforms of respective sections of the clamping circuit shown in FIG. 15;

DETAILED DESCRIPTION OF THE PREFERRED EMBODIMENTS

Figure 1:
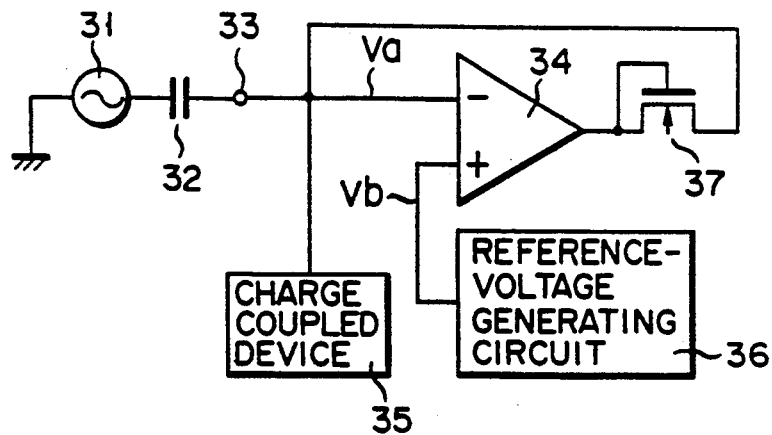
FIG. 1 is a block diagram showing a conventional clamping circuit.

FIG. 3 is a block diagram for expaining the principle of a clamping circuit according to the present invention. In FIG. 3, a signal from an input signal source 11 is supplied to an input pin 13 of a semicondutor IC through a coupling capacitor 12. A signal voltage Va supplied to the input pin 13 is supplied to one input tweminal of a voltage comparator 14 comprisimg an operational amplifier. The other input terminal of the voltage comparator 14 receives a reference voltage Vb generated by a reference voltage generating circuit 15.

Reference numeral 16 denotes a bias voltage supplying circuit for supplying a predetermined DC bias voltage Vc to the input pin 13. A switch circuit 17 which is ON/OFF-controlled based on the output signal from the voltage comparator 14 is inserted between the output terminal of the bias voltage supplying circuit 16 and the input pin 13.

If no voltage drop occurs across the switch circuit 17, the DC bias voltage Vc from the bias voltage supplying circuit 16 is directly applied to the input pin 13. For this reason, when a power supply voltage is lowered, the value of the reference voltage Vb can be desirably set within the range of the power supply voltage, and the setting range of the reference voltage Vb can be widened.

Various embodiments of the present invention will now be described.

FIG. 4 is a block diagram showing an arrangement of an embodiment when the present invention is applied to a low-voltage level clamping circuit used in a CTD having an input section of a clamp input bias method. In this case, the input signal source 11 comprises, e.g., a video signal generating source for generating a video signal Vin (FIG. 5) including a synchronizing signal. The video signal Vin is supplied to the input pin 13 of the CTD-IC through the coupling capacitor 12. The signal voltage Va supplied to the input pin 13 (FIG. 5) is also supplied to the inverting input terminal ("−" terminal) of the comparator 14, and is also supplied to a CCD 19. The non-inverting input terminal ("+" terminal) of the comparator 14 receives the reference voltage Vb from the reference voltage generating circuit 15.

The switch circuit 17 inserted between the input pin 13 and the output terminal of the bias voltage supplying circuit 16 for supplying the predetermined DC bias voltage Vc comprises a CMOS transfer gate consisting of a parallel circuit of, e.g., an N-channel MOS transistor 20 and a P-channel MOS transistor 21. An output signal Vd from the comparator 14 is supplied to the gate of the P-channel MOS transistor 21 of the CMOS transfer gate through a inverter 23. The output from the inverter 23 is supplied to the gate of the N-channel MOS transistor 20 of the CMOS transfer gate through another inverter 24.

In this arrangement, the input signal source 11 generates, for example, the video signal Vin including a synchronizing signal. The video signal Vin is supplied through the coupling capacitor 12. Assuming that the input signal voltage Va supplied to the comparator 14 is equal to or higher than the reference voltage Vb, the output signal Vd from the comparator 14 goes to "0" level. In this case, the output from the inverter 23 goes to "1" level, and the output from the inverter 24 goes to "0" level. Thus, both the P-channel MOS transistor 21 and the N-channel MOS transistor 20 of the CMOS transfer gate 17 are disabled. Therefore, in this case, the DC bias voltage Vc from the bias voltage supplying circuit 16 is not supplied to the input pin 13.

On the other hand, when the input signal voltage Va is lower than the reference voltage Vb, the output signal Vd of the comparator 14 goes to "1" level. In this case, the output from the inverter 23 goes to "0" level, and the output from the inverter 24 goes to "1 level. As a result, both the P-channel MOS transistor 21 and the N-channel MOS transistor 20 of the CMOS transfer gate 17 are enabled. In this case, the DC bias voltage Vc from the bias voltage supplying circuit 16 is supplied to the input pin 13. The input pin 13 is charged by a time constant according to the ON resistance of the CMOS transfer gate 17 and the capacitance of the coupling capacitor 12. When the signal voltage Va becomes equal to or higher than the reference voltage Vb from the reference voltage generating circuit 15, the output from the comparator 14 is inverted to "0" level. Therefore, the lowest value of the input signal voltage Va is clamped at the reference voltage Vb.

In the circuit of this embodiment, the two inverters 23 and 24 are arranged to satisfactorily drive the gate constituted by the MOS transistors 20 and 21. When the N-channel MOS transistor 20 in the CMOS transfer gate 17 can be satisfactorily driven by the output from the comparator 14, the inverter 24 is omitted, as shown in FIG. 6, so that the output from the comparator 14 is directly input to the gate of the N-channel MOS transistor 20 to drive the MOS transistor 20.

The power supply voltage $V_{CC}$ may be used as the bias voltage Vc from the bias voltage supplying circuit 16, as shown in FIG. 7.

Since the output impedance of the bias voltage supplying circuit 16 is normally considerably high, the DC bias voltage Vc supplied from the bias voltage supplying circuit 16 must be set to be higher than the reference voltage Vb output from the reference voltage generating circuit 15. However, if the output impedance of the bias voltage supplying circuit 16 is set to be sufficiently low, the DC bias voltage Vc may be set to be equal to the reference voltage Vb, as shown in FIG. 8. In this case, the reference voltage generating circuit 15 can also serve as the bias voltage supplying circuit 16, as shown in FIG. 9.

When a resistor R having a high resistance which does not cause distortion of an input signal waveform is connected between the input pin 13 and the reference voltage generating circuit 15, as shown in FIG. 10, the clamping operation can be quickly restored even when an input DC voltage level at the input pin 13 is unexpectedly increased.

Figure 12:
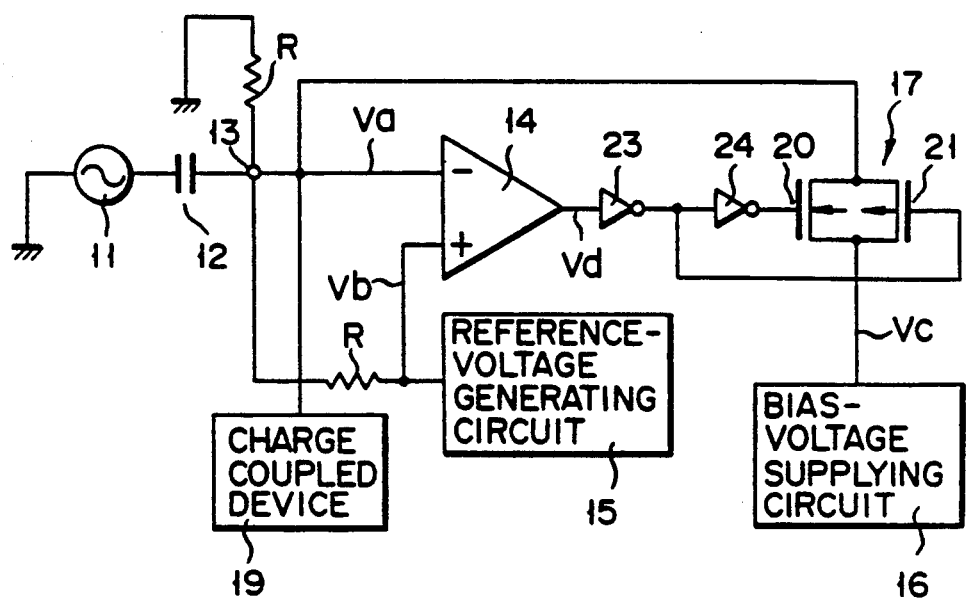

As shown in FIG. 11, when a resistor R is connected between the input pin 13 and a ground potential, the same effect as described above can be obtained. Alternatively, as shown in FIG. 12, resistors having a high resistance may be connected between the input pin 13 and the output terminal of the reference voltage generating circuit 15 and between the input pin 13 and the ground potential.

Figure 13:
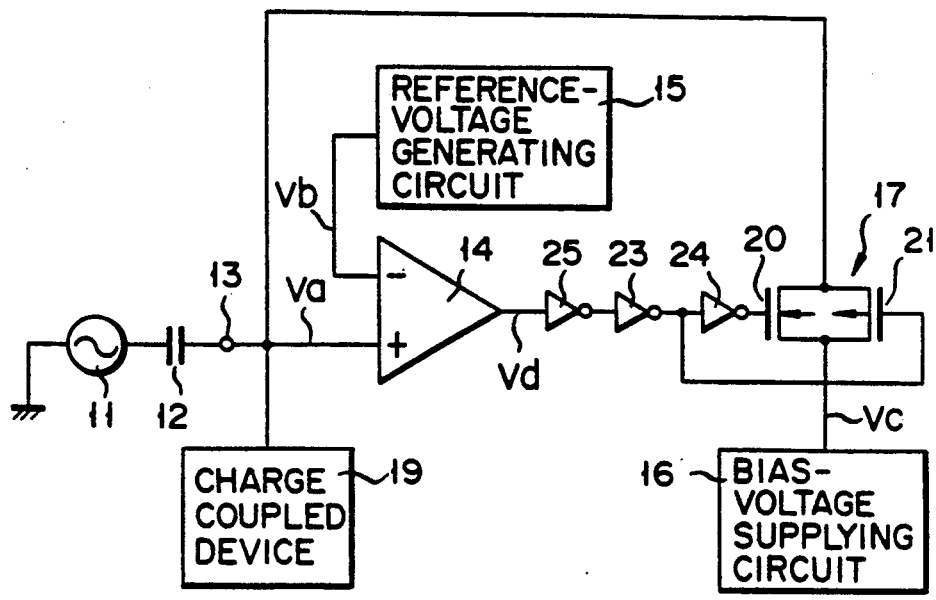
FIG. 13 is a block diagram showing another embodiment of a clamping circuit according to the present invention.

FIG. 13 is a block diagram showing an arrangement of another embodiment when the present invention is applied to a low-voltage level clamping circuit used in a CTD having an input section of a clamp input bias method. A difference between the circuit of this embodiment and the circuit shown in FIG. 4 is that the signal voltage Va supplied to the input pin 13 is supplied to the non-inverting input terminal ("+" terminal) of the comparator 14, and the reference voltage Vb from the reference voltage generating circuit 15 is supplied to the inverting input terminal ("−" terminal) of the comparator 14. Thus, a new inverter 25 is added between the output terminal of the comparator 14 and the inverter 23.

Since the voltages at the non-inverting and inverter input terminals are opposite to those in the embodiment shown in FIG. 4, the output levels of the comparator 14 are also opposite to those in FIG. 4. However, since these levels are inverted by the inverter 25, they are the same as those of the comparator 14 in the embodiment shown in FIG. 4. The operation of this embodiment is substantially the same as that in FIG. 4, except for the above operation, and a description thereof will be omitted.

Figure 2:
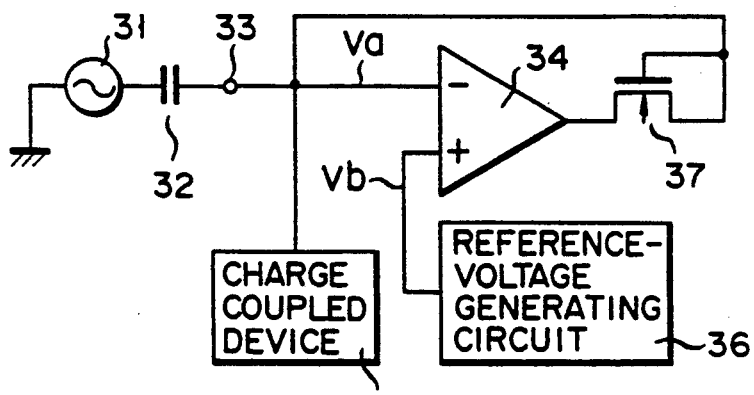
FIG. 2 is a block diagram showing another conventional clamping circuit.
Figure 14:
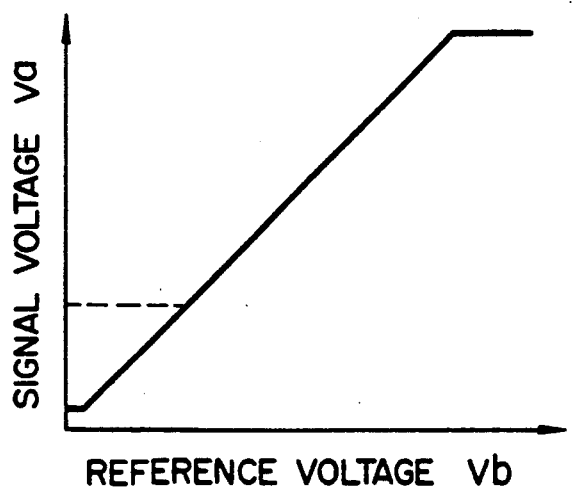
FIG. 14 is a graph showing a reference voltage Vb vs. signal voltage Va characteristic curve in the conventional clamping circuits shown in FIGS. 1 and 2 and the clamping circuit of the present invention shown in FIGS. 4 and 13.

FIG. 14 is a graph showing the relationship between the reference voltage Vb and the signal voltage Va in the circuits of the embodiments shown in FIGS. 4 and 13. As indicated by a solid line in FIG. 14, according to the circuit of the above embodiments, the lower limit value capable of clamping the signal voltage Va is widened to a lower limit above which the comparator 14 can be normally operated. In the conventional circuits shown in FIGS. 1 and 2, as indicated by a broken line in FIG. 14, the clamping range is narrowed by the threshold voltage of the transistor 37.

In the circuit of the embodiment shown in FIG. 13, a resistor having a high resistance which does not cause distortion of an input signal waveform is inserted between the input pin 13 and the output terminal of the reference voltage generating circuit 15 or between the input pin 13 and the ground potential as in the modifications in FIGS. 10 to 12 associated with the embodiment shown in FIG. 4, so that the clamping operation can be quickly restored even when the input DC voltage level at the input pin 13 is unexpectedly increased.

FIG. 15 is a block diagram showing an arrangement of an embodiment when the present invention is applied to high-level clamping circuit used in a CTD having an input section of a clamp input bias method. A difference between the circuit of this embodiment and the circuit shown in FIG. 4 is that a new inverter 26 is inserted between the output terminal of the comparator 14 and the inverter 23.

In this arrangement, the input signal source 11 generates the video signal Vin including a high-level synchronizing signal, as shown in the waveform chart of FIG. 16. The video signal Vin is supplied through the coupling capacitor 12. Assuming that the input signal voltage Va applied to the comparator 14 is equal to or lower than the reference voltage Vb, the output signal Vd from the comparator 14 goes to "1" level. The output from the inventer 26 goes to "0" level, and the output from the inventer 24 goes to "0" level. Thus, both the P-channel MOS transistor 21 and the N-channel MOS transistor 20 in the CMOS transfer gate 17 are disabled. Therefore, in this case, the DC bias voltage Vc from the bias voltage supplying circuit 16 is not supplied to the input pin 13.

On the other hand, when the input signal voltage Va is higher than the reference voltage Vb, the output signal Vd from the comparator 14 goes to "0" level. In this case, the output from the inverter 26 goes to "1" level, the output from the inverter 23 goes to "0" level, and the output from the inverter 24 goes to "1" level. As a result, both the P-channel MOS transistor 21 and the N-channel MOS transistor 20 in the CMOS transfer gate 17 are enabled. Therefore, the DC bias voltage Vc from the bias voltage supplying circuit 16 is supplied to the input pin 13, and the input signal voltage Va is clamped at the reference voltage Vb from the reference voltage generating circuit 15.

In this case, the DC bias voltage Vc supplied from the bias voltage supplying circuit 16 must be set to be lower than the reference voltage Vb output from the reference voltage generating circuit 15.

Figure 17:
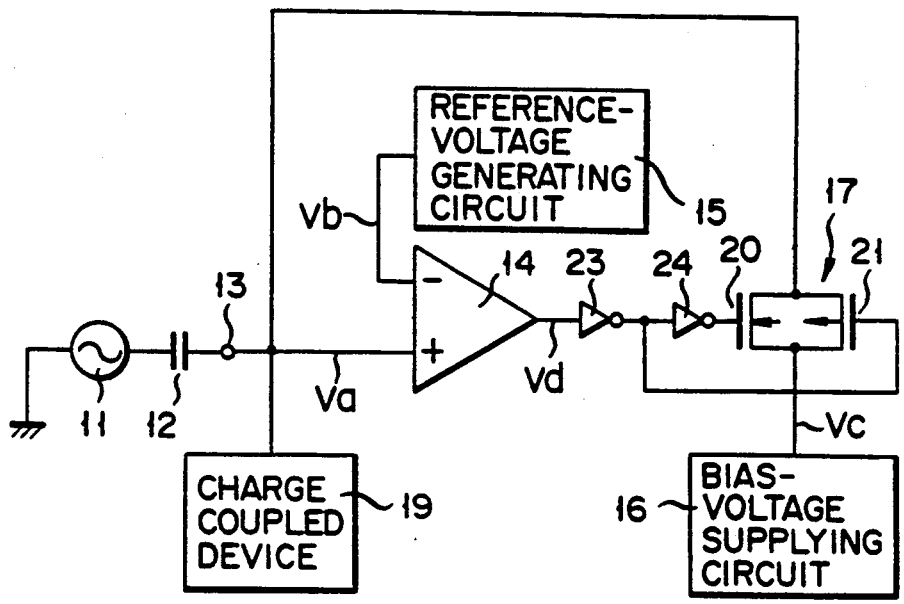
FIG. 17 is a block diagram showing still another embodiment of a clamping circuit according to the present invention.

Fig. 17 is a block diagram showing an arrangement of another embodiment when the present invention is applied to a high-level clamping circuit used in a CTD having an input section of a clamp input bias method. A difference between the circuit of this embodiment and the circuit shown in FIG. 4 is that the signal voltage Va supplied to the input pin 13 is supplied to the non-inverting input terminal ("+" terminal) of the comparator 14, and the reference voltage Vb from the reference voltage generating circuit 15 is supplied to the inverting input terminal ("−" terminal).

Figure 18:
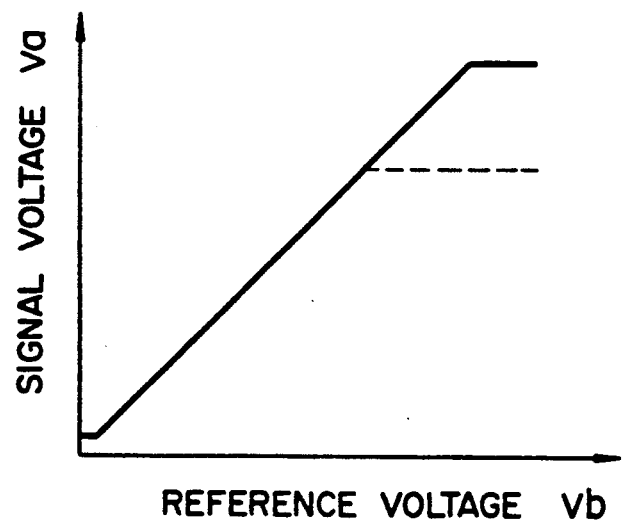
FIG. 18 is a graph showing a reference voltage Vb vs. signal voltage Va characteristic curve in the conventional clamping circuits shown in FIG. 1 and 2 and the clamping circuit of the present invention shown in FIGS. 15 and 17.

FIG. 18 is a graph showing the relationship between the reference voltage Vb and the signal voltage Va in the circuits of the embodiments shown in FIGS. 15 and 17. As indicated by a solid line in FIG. 18, according to the circuits of the above embodiments shown in FIGS. 15 and 17, the upper limit value capable of clamping the signal voltage Va is widened to almost a power supply voltage. In the conventional circuits shown in FIGS. 1 and 2, as indicated by a broken line in FIG. 18, the clamping range is narrowed by the threshold voltage of the transistor 37.

Note that in the circuits of the embodiments shown in FIGS. 15 and 17, a resistor having a high resistance which does not cause distortion of an input signal waveform is inserted between the input pin 13 and the output terminal of the reference voltage generating circuit 15 and/or between the input pin 13 and the ground potential like in the modifications FIGS. 10 to 12 associated with the embodiment shown in FIG. 4, so that the clamping operation can be quickly restored even when the input DC voltage level at the input pin 13 is unexpectedly increased.

According to the circuits of the above embodiments, even when the power supply voltage is lowered, the setting range of the reference voltage as the clamping voltage can be widened, thus allowing easy circuit design.

The present invention is not limited to the above embodiments, and various changes and modifications may be made within the spirit and scope of the invention. For example, in the circuit of each embodiment, the switch circuit 17 comprises the CMOS transfer gate consisting of the N-channel MOS transistor 20 and the P-channel MOS transistor 21. When the value of the reference voltage Vb is near the power supply voltage used in the comparator 14 or each inverter, the N-channel MOS transistor 20 may be omitted. When the value of the reference voltage Vb is near the ground potential of 0 V, the P-channel MOS transistor 21 may be omitted for the following reason. That is, when the value of the reference voltage Vb is near the power supply voltage, the P-channel MOS transistor 21 is operated in a non-saturated state, and almost no voltage drop occurs across its source and drain. On the other hand, when the value of the reference voltage Vb is near the ground potential, the N-channel MOS transistor 20 is operated in a non-saturated state, and almost no voltage drop occurs across its source and drain. Note that like in the above embodiments, when both the P- and N-channel MOS transistors 20 and 21 are arranged, almost no voltage drop occurs regardless of the reference voltage Vb.

The reference voltage generating circuit 15 in each embodiment can be realized by a voltage dividing circuit consisting of a series circuit of a plurality of MOS transistors or a series circuit of a plurality of resistors.

In each embodiment, the present invention is applied to the clamping circuit used in the CTD-IC having the input section of the clamp input bias method. However, the present invention is not limited to the CTD-IC but may be applied to the other clamping circuits for a MOS-IC, bipolar IC, and the like.

As described above according to the present invention, an input voltage and a reference voltage are compared by voltage comparison means, and a switch means is ON/OFF-controlled on the basis of the comparison result, so that a bias voltage from a bias voltage supplying means is supplied to a signal input terminal through the switch means. Therefore, a clamping circuit is provided which can widen the setting range of the reference voltage as a clamping voltage and allows easy circuit design even when a power supply voltage is lowered.

What is claimed is:

1. A clamping circuit comprising:
 a signal input terminal to which an input signal voltage is supplied through a coupling capacitor;
 reference voltage generating means;
 voltage comparison means, including an operational amplifier having one input terminal to which the input signal voltage supplied to said input terminal is applied and another input terminal to which a reference voltage generated by said reference voltage generating means is applied, for comparing the input signal voltage to the reference voltage;
 bias voltage supplying means; and
 means, responsive to the voltage comparison means, for selectively electrically coupling said bias voltage supplying means to said signal input terminal, including a transmission gate having a first terminal coupled to said bias voltage supplying means and a second terminal, coupled to said signal input terminal.

2. A clamping circuit according to claim 1, wherein said transmission gate comprises first and second MOS transistors connected in parallel between said bias voltage supplying means and said signal input terminal.

3. A clamping circuit comprising:
 a signal input terminal to which an input signal voltage is supplied through a coupling capacitor;
 reference voltage generating means;
 voltage comparison means, including an operational amplifier having one input terminal to which the input signal voltage supplied to said signal input terminal is applied and another input terminal to which a reference voltage generated by said reference voltage generating means is applied, for comparing the input signal voltage to the reference voltage;
 bias voltage supplying means; and
 means, responsive to the voltage comparison means, for selectively electrically coupling said bias voltage supplying means to said signal input terminal, having a first terminal coupled to said bias voltage supplying means, a second terminal, coupled to said signal input terminal, and a bi-directional current path between the first and second terminals,
 a bias voltage of said bias voltage supplying means being a reference voltage of said reference voltage generating means.

4. A clamping circuit comprising:
 a signal input terminal to which an input signal voltage is supplied through a coupling capacitor;
 reference voltage generating means;
 voltage comparison means, including an operational amplifier having one input terminal to which the input signal voltage supplied to said signal input terminal is applied and another input terminal to which a reference voltage generated by said reference voltage generating means is applied, for comparing the input signal voltage to the reference voltage;
 bias voltage supplying means, connected to said reference voltage generating means; and
 means, responsive to the voltage comparison means, for selectively electrically coupling said bias voltage supplying means to said signal input terminal, having a first terminal coupled to said bias voltage supplying means, a second terminal, coupled to said signal input terminal, and a bi-directional current path between the first and second terminals.

5. A clamping circuit comprising:
 a signal input terminal to which an input signal voltage is supplied through a coupling capacitor;
 reference voltage generating means;

voltage comparison means, including an operational amplifier having one input terminal to which the input signal voltage supplied to said signal input terminal is applied and another input terminal to which a reference voltage generated by said reference voltage generating means is applied, for comparing the input signal voltage to the reference voltage;

bias voltage supplying means;

means, responsive to the voltage comparison means, for selectively electrically coupling said bias voltage supplying means and said signal input terminal, including a transmission gate having a first terminal coupled to said bias voltage supplying means and a second terminal, coupled to said signal input terminal, and a resistor connected between said signal input terminal and said reference voltage generating means.

6. A clamping circuit comprising:

a signal input terminal to which an input signal voltage is supplied through a coupling capacitor;

reference voltage generating means;

voltage comparison means, including an operational amplifier having one input terminal to which the input signal voltage supplied to said signal input terminal is applied and another input terminal to which a reference voltage generated by said reference voltage generating means is applied, for comparing the input signal voltage to the reference voltage;

bias voltage supplying means;

means, responsive to the voltage comparison means, for selectively electrically coupling said bias voltage supplying means and said signal input terminal, including a transmission gate having a first terminal coupled to said bias voltage supplying means and a second terminal, coupled to said signal input terminal, and a resistor connected between said signal input terminal and the ground.

7. A clamping circuit comprising:

a signal input terminal to which an input signal voltage is supplied through a coupling capacitor;

reference voltage generating means;

voltage comparison means including an operational amplifier, having one input terminal to which the input signal voltage supplied to the signal input terminal is applied and the other input terminal to which a reference voltage generated by the reference voltage generating means is applied, for comparing the two input voltages;

bias voltage supplying means; and switch means, responsive to the voltage comparator means, for selectively electrically coupling the bias voltage supplying means to the signal input terminal, having a first terminal coupled to the bias voltage supplying means and a second terminal, coupled to the signal input terminal, including a first MOS transistor, coupled between the bias voltage supplying means and the signal input terminal, having a channel of a first conductivity type and, a second MOS transistor, coupled in parallel with the first MOS transistor, having a channel of a second conductivity type.

8. A clamping circuit comprising:

a signal input terminal to which an input signal voltage is supplied through a coupling capacitor;

reference voltage generating means;

voltage comparison means including an operational amplifier, having one input terminal to which the input signal voltage supplied to the signal input terminal is applied and the other input terminal to which a reference voltage generated by the reference voltage generating means is applied, for comparing the input signal voltage to the reference voltage, including means for generating a voltage comparison signal;

bias voltage supplying means; and means, responsive to the voltage comparison means, for selectively electrically coupling the bias voltage supplying means and said signal input terminal, including a transmission gate having a first terminal coupled to said bias voltage supplying means and a second terminal, coupled to said signal input terminal.

9. A clamping circuit comprising:

a signal input terminal to which an input signal voltage is supplied through a coupling capacitor;

voltage generating means;

voltage comparison means including an operational amplifier, having one input terminal to which the input signal voltage supplied to the signal input terminal is applied and the other input terminal to which a voltage generated by the voltage generating means is applied, for comparing the input signal voltage to the voltage, including means for generating a voltage comparison signal; and means, responsive to the voltage comparison means, for selectively electrically coupling the bias voltage supplying means to said signal input terminal, having a first terminal coupled to said bias voltage supplying means, a second terminal, coupled to said signal input terminal, and a bi-directional current path between the first and second terminals.

10. A clamping circuit comprising:

a signal input terminal to which an input signal voltage is supplied through a coupling capacitor;

reference voltage generating means;

voltage comparison means including an operational amplifier, having one input terminal to which the input signal voltage supplied to the signal input terminal is applied and the other input terminal to which a reference voltage generated by the reference voltage generating means is applied, for comparing the input signal voltage to the reference voltage, including means for generating a voltage comparison signal;

bias voltage supplying means, coupled to the reference voltage generating means; and means, responsive to the voltage comparison means, for selectively electrically coupling the bias voltage supplying means to said signal input terminal, having a first terminal coupled to said bias voltage supplying means, a second terminal, coupled to said signal input terminal, and a bi-directional current path between the first and second terminals.

11. A clamping circuit comprising:

a signal input terminal to which an input signal voltage is supplied through a coupling capacitor;

a resistor, including a first terminal coupled to the signal input terminal, and a second terminal;

reference voltage generating means, coupled to the second terminal of the resistor;

voltage comparison means including an operational amplifier, having one input terminal to which the input signal voltage supplied to the signal input terminal is applied and the other input terminal to which a reference voltage generated by the reference voltage generating means is applied, for comparing the input signal voltage to the reference voltage, including means for generating a voltage comparison signal;

bias voltage supplying means; and switch means, responsive to the voltage comparator means, for selectively electrically coupling the bias voltage supplying means to the signal input terminal, having a first terminal coupled to the bias voltage supplying means and a second terminal, coupled to the signal input terminal, including a first MOS transistor, coupled between the bias voltage supplying means and the signal input terminal, having a channel of a first conductivity type, and a second MOS transistor, coupled in parallel with the first MOS transistor, having a channel of a second conductivity type.

12. A clamping circuit including a ground comprising:

a signal input terminal to which an input signal voltage is supplied through a coupling capacitor;

a resistor, including a first terminal coupled to the signal input terminal, and a second terminal coupled to the ground;

reference voltage generating means;

voltage comparison means including an operational amplifier, having one input terminal to which the input signal voltage supplied to the signal input terminal is applied and the other input terminal to which a reference voltage generated by the reference voltage generating means is applied, for comparing the input signal voltage to the reference voltage, including means for generating a voltage comparison signal;

bias voltage supplying means; and switch means, responsive to the voltage comparator means, for selectively electrically coupling the bias voltage supplying means to the signal input terminal, having a first terminal coupled to the bias voltage supplying means and a second terminal, coupled to the signal input terminal, including a first MOS transistor, coupled between the bias voltage supplying means and the signal input terminal, having a channel of a first conductivity type, and a second MOS transistor, coupled in parallel with the first MOS transistor, having a channel of a second conductivity type.

13. A clamping circuit comprising:

a signal input terminal to which an input signal voltage is supplied through a coupling capacitor;

reference voltage generating means;

voltage comparison means, including an operational amplifier having one input terminal to which the input signal voltage supplied to the signal input terminal is applied and another input terminal to which a reference voltage generated by the reference voltage generating means is applied, for comparing the input signal voltage to the reference voltage;

bias voltage supplying means;

means, responsive to the voltage comparison means, for selectively electrically coupling the bias voltage supplying means to said signal input terminal, having a first terminal coupled to said bias voltage supplying means, a second terminal, coupled to said signal input terminal, and a bi-directional current path between the first and second terminals;

a resistor connected between the signal input terminal and the reference voltage generating means; and a resistor connected between the signal input terminal and the ground.

14. A clamping circuit including a ground comprising:

a signal input terminal to which an input signal voltage is supplied through a coupling capacitor;

a first resistor, including a first terminal coupled to the signal input terminal, and a second terminal;

a second resistor, including a first terminal coupled to the signal input terminal, and a second terminal coupled to the ground;

reference voltage generating means, coupled to the second terminal of the first resistor;

voltage comparison means including an operational amplifier, having one input terminal to which the input signal voltage supplied to the signal input terminal is applied and the other input terminal to which a reference voltage generated by the reference voltage generating means is applied, for comparing the input signal voltage to the reference voltage, including means for generating a voltage comparison signal;

bias voltage supplying means; and means, responsive to the voltage comparison means, for selectively electrically coupling said bias voltage supplying means to said signal input terminal, including a transmission gate having a first terminal coupled to the bias voltage supplying means and a second terminal, coupled to said signal input terminal.

15. The clamping circuit of claim 9, wherein the switch means includes a transmission gate.

16. A clamping circuit according to claim 1, wherein the reference voltage generating means comprises a circuit with an output impedance and the bias voltage supplying means comprises a different circuit with an output impedance different from that of the circuit of the reference voltage generating means.

17. The clamping circuit of claim 2, wherein the first MOS transistor includes a gate, coupled to the voltage comparison signal; and the second MOS transistor includes a gate, coupled to an inverted voltage comparison signal.

18. The clamping circuit of claim 8, wherein the transmission gate comprises first and second MOS transistors connected in parallel between the bias voltage supplying means and the signal input terminal.

19. The clamping circuit of claim 18, wherein the first MOS transistor includes a gate, coupled to the voltage comparison signal; and the second MOS transistor includes a gate, coupled to an inverted voltage comparison signal.

20. The clamping circuit of claim 7, wherein the reference voltage generating means comprises a circuit with an output impedance and the bias voltage supplying means comprises a different circuit with an output impedance different from that of the circuit of the reference voltage generating means.

21. The clamping circuit of claim 7, wherein the first MOS transistor includes.

a gate, coupled to the voltage comparison means; and the second MOS transistor includes a gate, coupled to an inverted voltage comparison means.

22. The clamping circuit of claim 10, wherein the switch means include a transmission gate.

* * * * *

UNITED STATES PATENT AND TRADEMARK OFFICE
CERTIFICATE OF CORRECTION

PATENT NO. : 5,206,553
DATED : April 27, 1993
INVENTOR(S) : Shin-Ichi IMAI et al.

It is certified that error appears in the above-indentified patent and that said Letters Patent is hereby corrected as shown below:

Column 12, line 67, penultimate line change "include" to --includes--.

Signed and Sealed this

Twenty-second Day of March, 1994

Attest:

BRUCE LEHMAN

*Attesting Officer*  *Commissioner of Patents and Trademarks*